United States Patent
Shen

(10) Patent No.: US 8,228,083 B2
(45) Date of Patent: Jul. 24, 2012

(54) TESTING SYSTEM AND TESTING METHOD

(75) Inventor: Lee-Cheng Shen, Hsinchu (TW)

(73) Assignee: Quanta Computer, Inc., Kuei Shan Hsiang, Tao Yuan Shien (TW)

( * ) Notice: Subject to any disclaimer, the term of this patent is extended or adjusted under 35 U.S.C. 154(b) by 418 days.

(21) Appl. No.: 12/609,145

(22) Filed: Oct. 30, 2009

(65) Prior Publication Data

US 2010/0283476 A1 Nov. 11, 2010

(30) Foreign Application Priority Data

May 8, 2009 (TW) ................................ 98115260 A

(51) Int. Cl.
*G01R 31/02* (2006.01)
*G01R 31/36* (2006.01)
(52) U.S. Cl. ......... 324/750.26; 324/754.01; 324/754.07; 324/755.01; 324/756.02; 324/762.01
(58) Field of Classification Search ... 324/76.01–762.06
See application file for complete search history.

(56) References Cited

U.S. PATENT DOCUMENTS

| | | | | |
|---|---|---|---|---|
| 6,194,907 B1 * | 2/2001 | Kanao et al. | ............. | 324/750.08 |
| 7,202,693 B1 * | 4/2007 | Kush | ........................ | 324/750.11 |
| 2002/0033706 A1 * | 3/2002 | Khazei | .......................... | 324/750 |
| 2005/0110508 A1 * | 5/2005 | Kishida | ......................... | 324/754 |
| 2010/0207638 A1 * | 8/2010 | Nien et al. | .................... | 324/537 |
| 2011/0227602 A1 * | 9/2011 | Schmidt et al. | .......... | 324/762.05 |

* cited by examiner

*Primary Examiner* — Melissa Koval
*Assistant Examiner* — Emily Chan
(74) *Attorney, Agent, or Firm* — Thomas|Kayden

(57) ABSTRACT

The invention discloses a testing system and a testing method, suitable for testing a DUT with double-sided signal pins. The testing system includes a testing platform and a pick-and-place device. The testing platform includes an electromagnetic shielding chamber and a test-bench module. The electromagnetic shielding chamber has an opening. The test-bench module is disposed in-between the electromagnetic shielding chamber. The pick-and-place device is movably disposed above the testing platform. The pick-and-place device includes an electromagnetic shielding cap and a signal transmission structure. When the pick-and-place device places the DUT on the test-bench module, the electromagnetic shielding cap cooperates with the electromagnetic shielding chamber of the testing platform to form an isolated space for isolating the DUT, and furthermore, the signal pin disposed on an upper surface of the DUT can be electrically connected to the test-bench module through the signal transmission structure.

15 Claims, 4 Drawing Sheets

TESTING SYSTEM AND TESTING METHOD

CROSS-REFERENCE TO RELATED APPLICATION

This design application claims priority to Taiwan Application Serial Number 098115260, filed May 8, 2009, which is incorporated herein by reference.

BACKGROUND OF THE INVENTION

1. Field of the Invention

The invention relates to a testing system and a testing method, and more particularly, to a testing system and a testing method with electromagnetic shielding utility.

2. Description of the Prior Art

With the rocketing development of the semiconductor technology, the four steps of designing, manufacturing, packeting and testing in producing an IC module are now individual professional subjects. With more complex structures, more functionalities and more demanding of preciseness, the testing skill of the IC module becomes a critical and necessary technique in ensuring the yield rate and speeding up the producing procedures.

In prior art, for maintaining high efficiency and stabilization in the IC module testing, it requires some specific testing instruments for holding the IC module under test, measuring signals and avoiding outer noises. There are many micro-sized IC modules appeared in many applications, which the compact IC modules usually have high electromagnetic sensitivity and tend to be affected by surrounding electromagnetic signals. Especially in the wireless radio application, e.g. radio frequency identification (RFID), the radio frequency integrated circuit (RFIC) and RF circuitry are easy to be interfered by other electronic devices around, such that it spoils the measurement and even threaten the safety of the testing operator.

To block the outer electromagnetic interference, a larger metal isolating box is utilized in prior art for covering the whole testing instrument set (usually including testing platform, mechanic arm, signal measuring device or signal wiring). It blocks the unwanted electromagnetic interference from the IC module under test by the metal shielding effect of the isolating box, therefore to strength the stability within the testing procedure.

However, the metal isolating box is costly and huge in size. Besides, the isolating box in prior art is usually sealed by utilizing a pneumatic or hydraulic moving tool. In the testing procedure, after the mechanic arm places the device under test (DUT) on the testing region, it needs to activate the moving tool of the isolating box and then wait until the isolating box is completely concealed, before further signal testing. It makes the testing procedure of the IC module in prior art time-consuming and inefficient.

On the other hand, in order to achieve the most various I/O applications in the most compact size on modern integrated IC module, the bus pins of the I/O interface are usually disposed on the upper and the lower surface of the IC module substrate, such that a double-sided pins arrangement, e.g. PCI-Express bus, double-sided system in package (SiP) module, is formed to replace the single-sized pins arrangement. However, traditional testing system, which is suitable for the DUT with single-sided pins, must repeat the testing procedure twice to test the DUT with double-sided pins, so as to ensure that the pins over different surfaces are working properly. In other word, when the DUT with signal pins on different surfaces is tested by the traditional testing system, it takes extra steps or processes to complete the whole procedure, and then it reduce the efficiency of the testing system.

The invention discloses a testing system and a testing method capable of efficiently completing electromagnetic isolation and suitable for the DUT with double-sided pins, so as to solve aforesaid problems.

SUMMARY OF THE INVENTION

A scope of the invention is to provide a testing system suitable for testing a device under test (DUT), e.g. an integrated IC module, a SiP module. The DUT has a first signal pin and a second signal pin. The first signal pin is disposed on a lower surface of the DUT. The second signal pin is disposed on an upper surface of the DUT.

According to an embodiment of the invention, the testing system includes a testing platform and a pick-and-place device. The testing platform includes an electromagnetic shielding chamber and a test-bench module. The electromagnetic shielding chamber has an opening. The test-bench module is disposed in the electromagnetic shielding chamber. The test-bench module has a first testing contact and a second testing contact. The pick-and-place device is movably disposed above the testing platform. The pick-and-place device includes an electromagnetic shielding cap and a signal wiring structure. The pick-and-place device is used for placing the DUT on the test-bench module.

When the pick-and-place device places the DUT on the test-bench module, the first signal pin of the DUT is electrically connected to the first testing contact of the test-bench module. In the mean time, the second signal pin of the DUT is electrically connected to the second testing contact of the test-bench module via the signal wiring structure.

Besides, the electromagnetic shielding cap corresponds to the opening of the electromagnetic shielding chamber (e.g. to have corresponding size, shape or thickness). When the pick-and-place device places the DUT on the test-bench module, the electromagnetic shielding cap cooperates with the electromagnetic shielding chamber of the testing platform to form an electromagnetic shielding space for isolating the DUT.

Another scope of the invention is to provide a testing method, which can be applied in a testing system including a testing platform and a pick-and-place device.

According to an embodiment of the invention, the testing method includes steps of: (a) providing a device under test (DUT), the DUT having a first signal pin and a second signal pin, the first signal pin being disposed on a lower surface of the DUT, the second signal pin being disposed on an upper surface of the DUT; (b) driving the pick-and-place device to place the DUT onto the testing platform; (c) electrically connecting the first signal pin and the second signal pin of the DUT to the testing platform; (d) utilizing the pick-and-place device to cooperate with the testing platform for forming an isolated space around the DUT; and (e) testing the isolated DUT.

Compared to prior art, in the testing system according to the invention, the pick-and-place device and the testing platform respectively have the corresponding electromagnetic shielding plate and the electromagnetic shielding chamber to form the isolated space for isolating the DUT. Accordingly, the testing system in the invention needs not huge-sized isolating box, and it can accomplish electromagnetic shielding within a compact space. Besides, the actions of placing and electromagnetic shielding the DUT in the invention are both completed by the pick-and-place device at the same time.

That is to say, the testing method in the invention is capable of ensuring a smooth and efficiency testing procedure, and it can be widely applied to various DUTs with I/O pins on single side or on both sides.

The advantage and spirit of the invention may be understood by the following recitations together with the appended drawings.

BRIEF DESCRIPTION OF THE APPENDED DRAWINGS

DETAILED DESCRIPTION OF THE INVENTION

Figure 1:
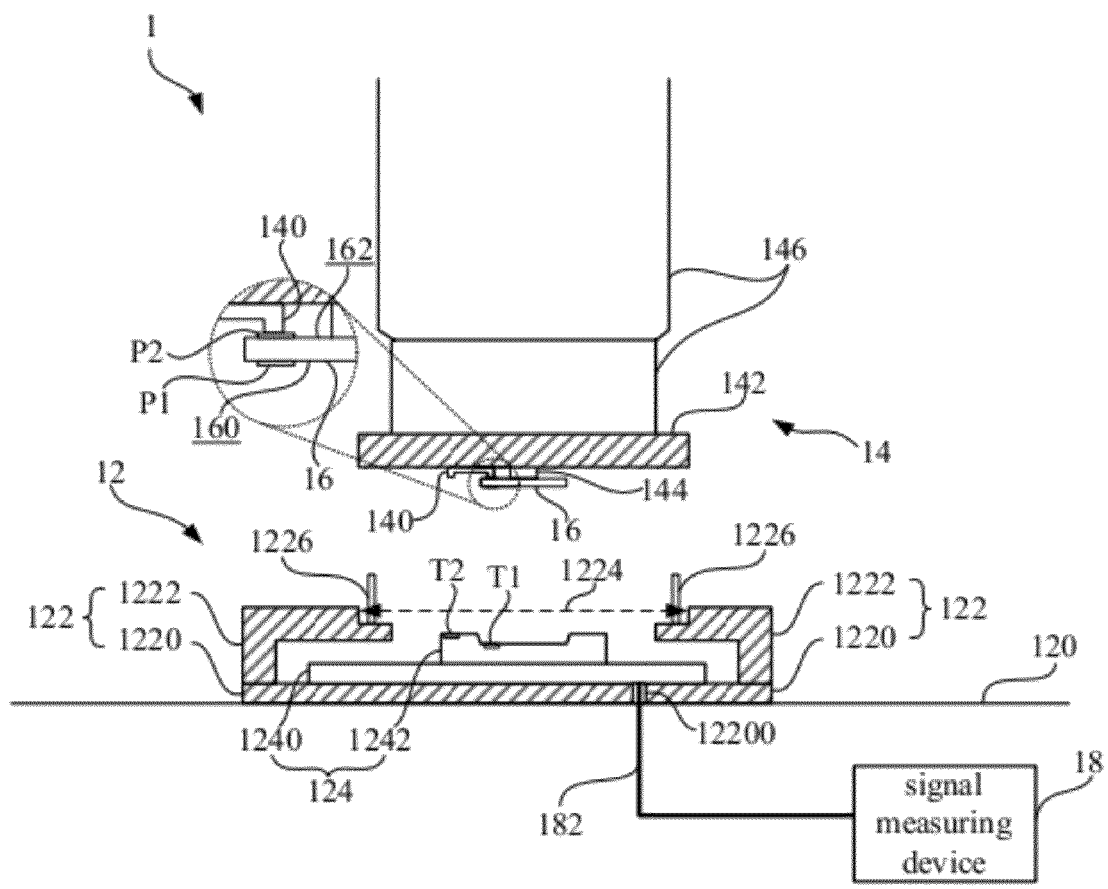
FIG. 1 is a schematic diagram illustrating a testing system 1 according to an embodiment of the invention.

Please refer to FIG. 1. FIG. 1 is a schematic diagram illustrating a testing system 1 according to an embodiment of the invention. As shown in FIG. 1, the testing system 1 in the embodiment includes a testing platform 12, a pick-and-place device 14 and signal measuring device 18. The testing system 1 is used for testing the device under test (DUT) 16.

In the embodiment, the DUT 16 can be an IC component. In another embodiment, the DUT 16 can also be an IC module. The IC module may include an IC component, a print circuit board (PCB) and some active or passive components in need. In other words, the testing system 1 in the invention can be applied in testing various electronic assemblies at component or module level. The DUT 16 in this embodiment may has a first signal pin P1 and a second signal pin P2. The first signal pin P1 is disposed on a lower surface 160 of the DUT 16. The second signal pin P2 is disposed on an upper surface 162 of the DUT 16. In other words, the DUT 16 can be an IC component or an IC module with double-sided I/O pins.

In the embodiment, the testing platform 12 includes a base body 120, an electromagnetic shielding chamber 122 and a test-bench module 124. The electromagnetic shielding chamber 122 may further include an electromagnetic shielding base plate 1220 and an electromagnetic shielding wall 1222. The electromagnetic shielding base plate 1220 is used for carrying the test-bench module 124. The electromagnetic shielding wall 1222 is disposed on the electromagnetic shielding base plate 1220 and surrounds the test-bench module 124. As shown in FIG. 1, the electromagnetic shielding chamber 122 can be formed by the electromagnetic shielding base plate 1220 and the electromagnetic shielding wall 1222 together. Besides, the surrounding electromagnetic shielding wall 1222 can also form an opening 1224 of the electromagnetic shielding chamber 122.

In this embodiment, the electromagnetic shielding chamber 122 includes some internal assemblies (i.e. the electromagnetic shielding base plate 1220 and the electromagnetic shielding wall 1222), but the invention is not limited to this example. In another embodiment, the electromagnetic shielding chamber 122 can be formed in one piece by itself.

The test-bench module 124 is disposed in the electromagnetic shielding chamber 122. The test-bench module 124 has a first testing contact T1 and a second testing contact T2. In this embodiment, the test-bench module 124 may further include a test-bench circuit board 1240 and a testing stand 1242. The test-bench 1240 is disposed on the electromagnetic shielding base plate 1220. The testing stand 1242 is disposed on and electrically connected to the test-bench circuit board 1240. Besides, the electromagnetic shielding wall 1222 is disposed on the electromagnetic shielding base plate 1220. As shown in FIG. 1, the electromagnetic shielding wall 1222 in the embodiment covers the test-bench circuit board 1240 and surrounds the testing stand 1242. The testing stand 1242 in the embodiment is a socket, the size and shape of which corresponds to the DUT 16. The testing stand 1242 is used for carrying the DUT 16.

Besides, the testing stand 1242 of the invention is not limited to the socket. In another embodiment of the invention, the testing stand 1242 can be an anisotropic conductive film. The anisotropic conductive film may also be utilized as a signal interchange medium between the test-bench circuit board 1240 and the DUT 16.

As shown in FIG. 1, the electromagnetic shielding base plate 1220 of the electromagnetic shielding chamber 122 may have a through hole 12200 thereon. The signal measuring device 18 of the testing system 1 may have a signal cable 182, which goes across the electromagnetic shielding chamber 122 through the through hole 12200. The signal cable 182 is used to form the coupling connection between the signal measuring device 18 and the test-bench circuit board 1240, such that the signal measuring device 18 can detect the signal variation on the test-bench circuit board 1240.

In order to match the testing requirement of the DUT 16, the test-bench module 124 in the embodiment correspondingly has a first testing contact T1 and a second testing contact T2. The first testing contact T1 and the second testing contact T2 are respectively located on the testing stand 1242 (as shown in FIG. 1). The test-bench circuit board 1240 of the test-bench module 124 is electrically connected to the DUT 16 via the testing stand 1242 and able to perform some testing operations toward the DUT 16.

To be noticed that, the aforesaid electromagnetic shielding base plate 1220 and the electromagnetic shielding wall 1222 of the electromagnetic shielding chamber 122 can be made of metal material. By the characteristic of the metal material, it can achieve the electromagnetic shielding effect. However, the material of the electromagnetic shielding chamber 122 is not limited to metal. In other case, the electromagnetic shielding chamber 122 can be made of a superconductor or some other conductive material.

The pick-and-place device 14 is disposed above the testing platform 12. The pick-and-place device 14 includes a signal wiring structure 140, an electromagnetic shielding cap 142, a pick-and-place structure 144 and a telescopic structure 146. The pick-and-place device 14 may move relative to the testing platform 12 by utilizing the telescopic structures 146. For example, the telescopic structure 146 in the embodiment can extend or shrink, so as to drive the pick-and-place device 14 move vertically relative to the testing platform 12. The signal wiring structure 140 can be, but not limited to, a printed circuit board having a metal conductive pattern and an intrinsic material. The signal wiring structure 140 can be disposed on the electromagnetic shielding cap 142.

The pick-and-place structure 144 of the pick-and-place device 14 is used for clasping or drawing the DUT 16. The pick-and-place structure 144 cooperates with the pick-and-place device 14 for placing the DUT 16 onto the testing stand 1242 of the test-bench module 124.

In the embodiment, the electromagnetic shielding cap 142 of the pick-and-place device 14 corresponds to the opening 1224 of the electromagnetic shielding chamber 122. For example, the electromagnetic shielding cap 142 and the opening 1224 of the electromagnetic shielding chamber 122 in the embodiment have equivalent widths and complementary shapes (shown in FIG. 1), and in addition, there are two guide pins 1226 disposed around the opening 1224 of the electromagnetic shielding chamber 122, but the correspondence between the electromagnetic shielding cap 142 and the opening 1224 is not limited to this.

Figure 2:
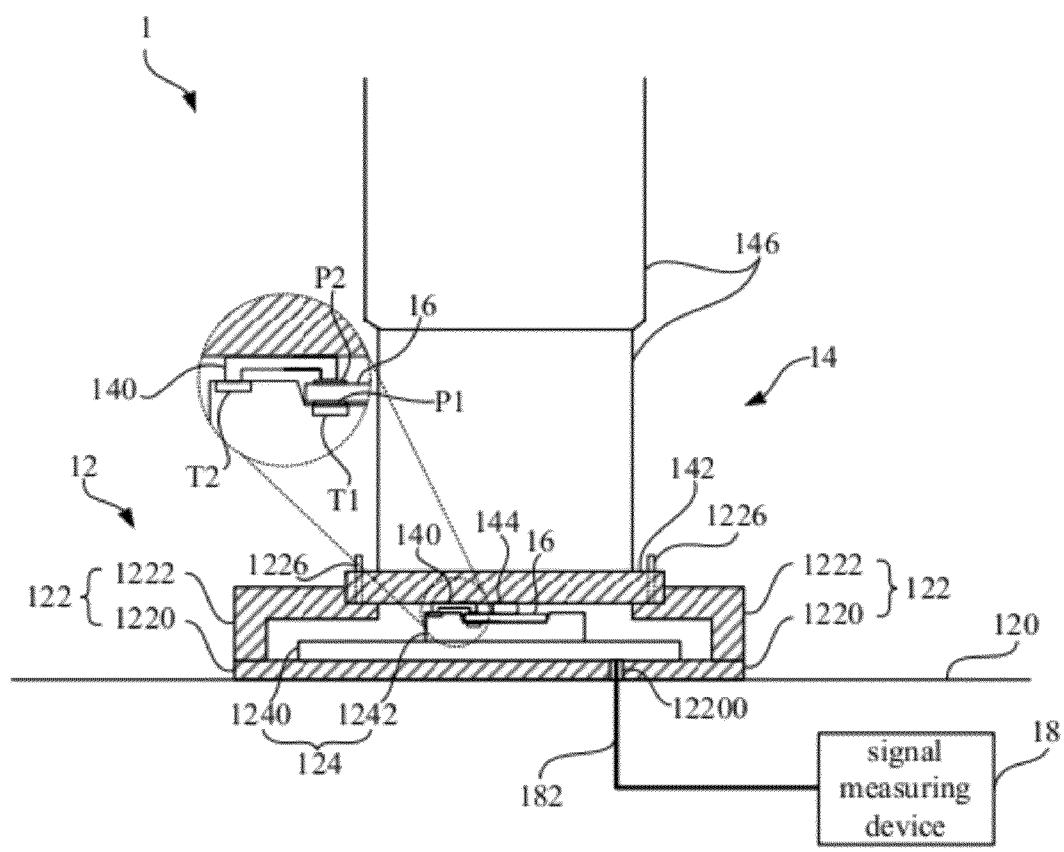
FIG. 2 is a schematic diagram illustrating that the pick-and-place device places the DUT on the testing platform.

Please refer to FIG. 2. FIG. 2 is a schematic diagram illustrating that the pick-and-place device 14 places the DUT 16 on the testing platform 12. With the telescopic structure 146 of the pick-and-place device 14 extending downward, the pick-and-place device 14 may place the DUT 16 on the testing platform 12.

As shown in FIG. 2, when the pick-and-place device 14 places the DUT 16 onto the testing stand 1242, the electromagnetic shielding cap 142 cooperates with the electromagnetic shielding chamber 122 of the testing platform 12 to form an isolated space, for isolating the DUT 16.

As shown in FIG. 2, when the pick-and-place device 14 places the DUT 16 on the test-bench module 124, the first signal pin P1 on the lower surface 160 of the DUT 16 can be electrically connected to the first testing contact T1 of the test-bench module 160.

In the meantime, the second signal pin P2 on the upper surface 162 of the DUT 16 can be electrically connected to the signal wiring structure 140 of the pick-and-place device 14 at first, and then via the signal wiring structure 140 the second signal pin P2 can be electrically connected to the second testing contact T2 of the test-bench module 124. In other words, the second signal pin P2 on the upper surface 162 can have an electrical connection with the second testing contact T2 through the signal wiring structure 140. Accordingly, the testing system 1 of the invention can perform testing to the signal pins upon the upper and lower surfaces of the DUT 16 in one-time pick-and-place procedure.

Besides, the pick-and-place device 14 of the invention has the electromagnetic shielding cap 142 and the testing platform 12 has the corresponding electromagnetic shielding wall 1222 and the electromagnetic shielding base plate 1220. By the time that the pick-and-place device 14 finishes the action of placing the DUT on the test-bench module, the electromagnetic shielding cap 142 and the electromagnetic shielding chamber 122 (the electromagnetic shielding wall 1222, electromagnetic shielding base plate 1220) complete the electromagnetic shielding effect for isolating the DUT.

Besides, the through hole 12200 of the electromagnetic shielding base plate 1220 in the electromagnetic shielding chamber 122 can be designed to match the diameter of the signal cable 182 or structurally anti-electromagnetic, so as to avoid the interference from the through hole 12200 to the electromagnetic shielding effect. Accordingly the signal measuring device 18 can measure the signals from the DUT 16 under electromagnetic shielding condition.

In practical applications, because the testing system 1 can fulfill electromagnetic shielding, it can effectively test IC components or IC modules under low noise, and is particularly useful in testing a circuit unit with radio frequency (RF) functions. In other words, the DUT 16 can be a RFIC component or a RFIC module, and correspondingly, the signal cable 182 for transmitting the testing signal can be a RF cable.

Figure 3:
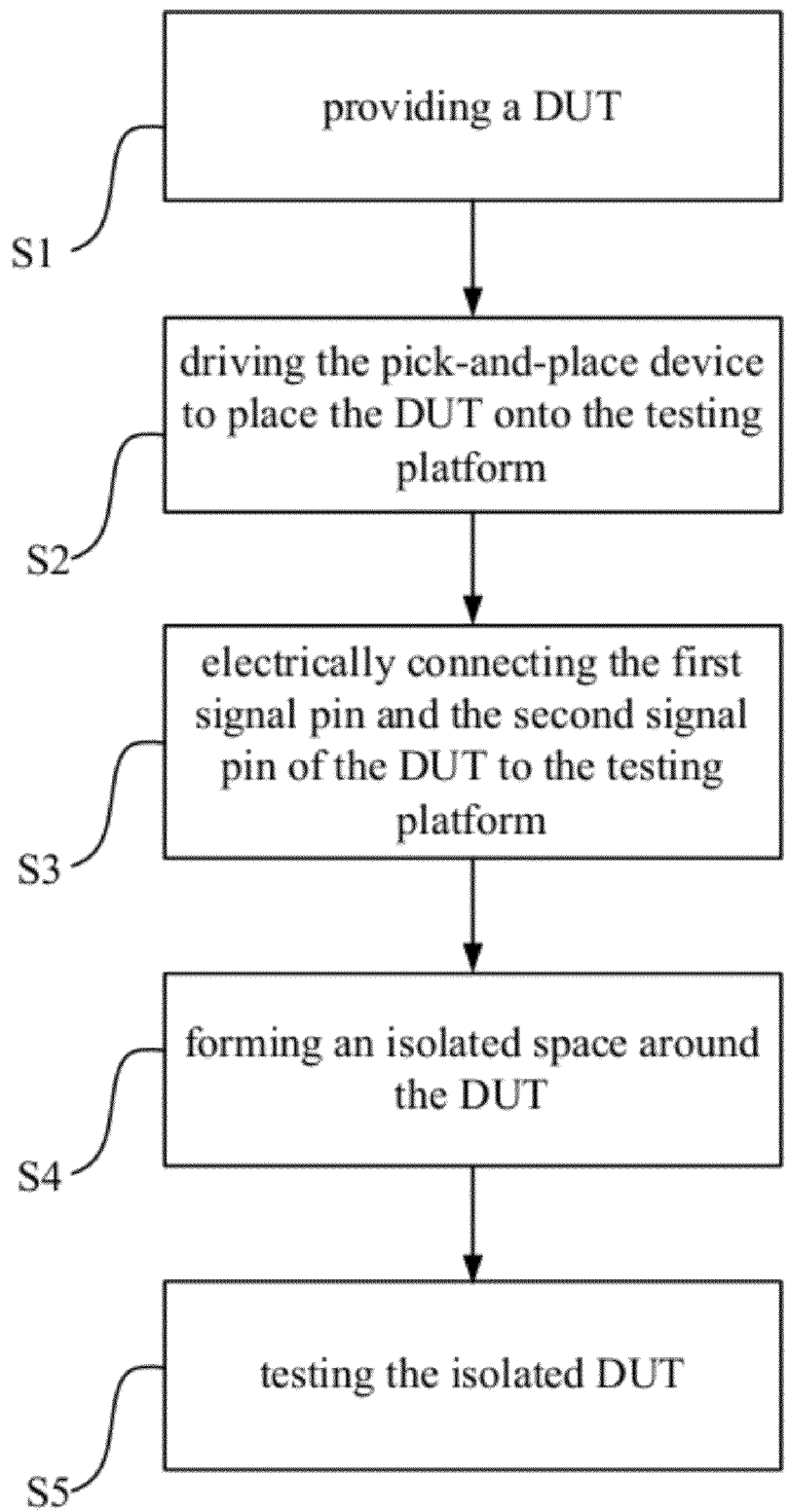
FIG. 3 is a flowchart illustrating a testing method according to another embodiment of the invention.

Please refer to FIG. 3. FIG. 3 is a flowchart illustrating a testing method according to another embodiment of the invention. The testing method is suitably applied in a testing system comprising a testing platform and a pick-and-place device. Please refer to FIG. 1 for practical hardware implementation of the testing system. The detail components are similar to the previous descriptions in the invention, and are not repeated here.

Firstly, step S1 is executed for providing a DUT, which has a first signal pin and a second signal pin. The first signal pin is disposed on a lower surface of the DUT. The second signal pin is disposed on the upper surface of the DUT. In practical applications, the DUT can be an IC component, or further be a RFIC component or a RFIC module.

Afterward, step S2 is executed for driving the pick-and-place device for placing the DUT onto the testing platform. The testing platform here may include an electromagnetic shielding chamber and a test-bench module. The test-bench module is disposed in the electromagnetic shielding chamber. The test-bench has a first testing contact and a second testing contact. In this embodiment, the DUT is placed on the test-bench module of the testing platform in the step S2.

Afterward, step S3 is executed for electrically connecting the first signal pin and the second signal pin of the DUT to the testing platform. In the embodiment, the pick-and-place device further comprises a signal wiring structure and an electromagnetic shielding cap. In step S3, the first signal pin of the DUT is electrically connected to the first testing contact. In the mean time, the second signal pin of the DUT is electrically connected to the second testing contact through the signal wiring structure in step S3.

Afterward, step S4 is executed for utilizing the pick-and-place device to cooperate with the testing platform for forming an electromagnetically isolated space around the DUT, for isolating the DUT. Finally, step S5 is executed for testing the isolated DUT.

The following paragraphs are about an experimental example for demonstrating the electromagnetic shielding effect of the testing system in the invention.

Figure 4:
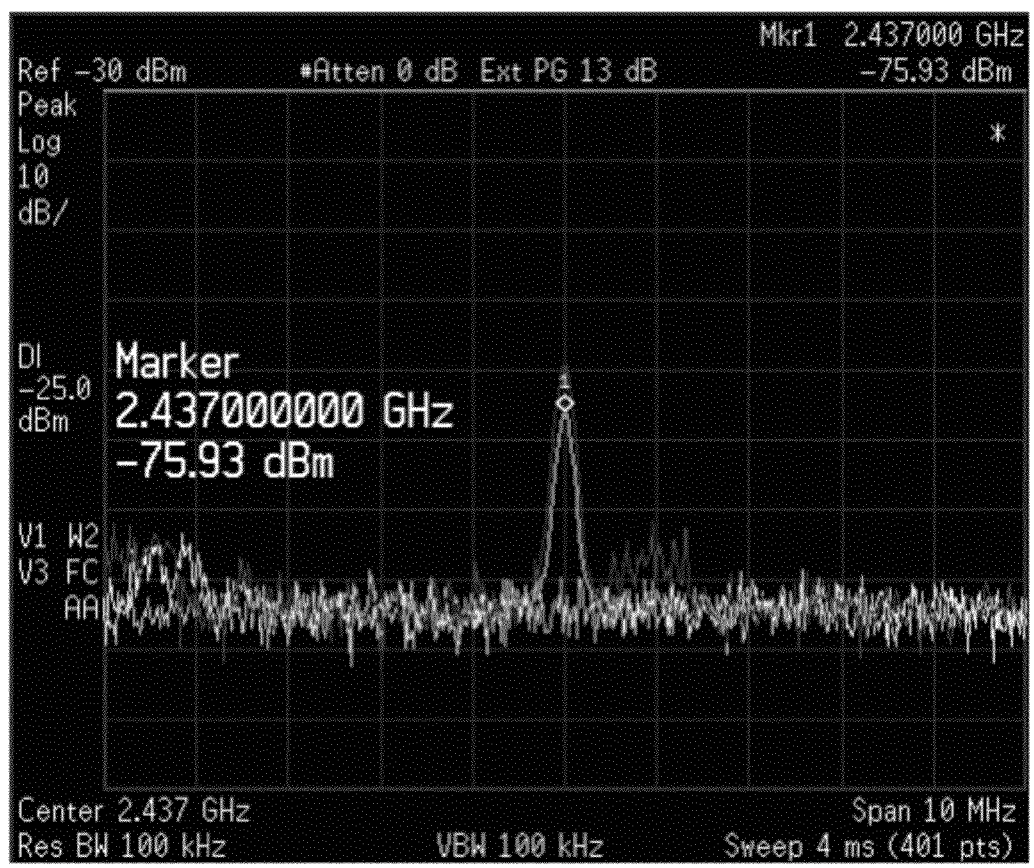
FIG. 4 is a measuring result plot of a spectrum analyzer measuring the isolated radio signal in the experimental example.

Please refer to FIG. 2 and FIG. 4. FIG. 4 is a measuring result plot of a spectrum analyzer measuring the isolated radio signal in the experimental example. In this experimental example, it utilizes a function generator (Agilent Technologies 8672A) for generating an experimental radio signal (16 dBm, 2.4 GHz). A transmitting antenna is set up in the isolated space of the testing system in FIG. 2. The experimental radio signal is transmitted through the signal cable to the transmitting antenna, and the experimental radio signal is further broadcasted by the transmitting antenna within the isolated space.

A receiving antenna (ETS-LINDGREN SN:00027183 Horn Antenna) is set up outside the isolated space. The receiving antenna is electrically connected to the spectrum analyzer (ADVANTEST R3162). The measuring result is shown in FIG. 4. The amplitude of the measured radio signal is −75.93 dBm (freq at 2.437 GHz). In conclusion, the isolating rate of the testing system in the invention can reach 91.93 dBm. (16 dBm−(−75.93 dBm)=91.93 dBm)

In conclusion, in the testing system according to the invention, the pick-and-place device and the testing platform respectively have the corresponding electromagnetic shielding cap and electromagnetic shielding chamber, which can cooperate to form the isolated space for isolating the DUT. The isolated space can provide a shielding effect to 91.93 dBm. Accordingly, the testing system in the invention needs not huge-sized isolating box, but it can accomplish electromagnetic shielding within a compact space. Besides, the actions of placing and electromagnetic shielding the DUT in the invention are both completed by the pick-and-place device at the same time. That is to say, the testing method in the invention is capable of ensuring a smooth and efficiency testing procedure, and it can be widely applied to various DUTs with pins on single side or on both sides.

With the example and explanations above, the features and spirits of the invention will be hopefully well described. Those skilled in the art will readily observe that numerous modifications and alterations of the device may be made while retaining the teaching of the invention. Accordingly, the above disclosure should be construed as limited only by the metes and bounds of the appended claims.

What is claimed is:

1. A testing system, suitable for testing a device under test (DUT), the DUT having a first signal pin and a second signal pin, the first signal pin being disposed on a lower surface of the DUT, the second signal pin being disposed on an upper surface of the DUT, the testing system comprising:
- a testing platform comprising:
  - an electromagnetic shielding chamber having an opening; and
  - a test-bench module disposed in the electromagnetic shielding chamber, the test-bench module having a first testing contact and a second testing contact; and
- a pick-and-place device movably disposed above the testing platform, the pick-and-place device comprising an electromagnetic shielding cap and a signal wiring structure, the pick-and-place device being used for placing the DUT on the test-bench module;
- wherein when the pick-and-place device places the DUT on the test-bench module, the first signal pin of the DUT is electrically connected to the first testing contact of the test-bench module, and the second signal pin of the DUT is electrically connected to the second testing contact of the test-bench module via the signal wiring structure;
- wherein the electromagnetic shielding cap corresponds to the opening of the electromagnetic shielding chamber, and when the pick-and-place device places the DUT on the test-bench module, the electromagnetic shielding cap cooperates with the electromagnetic shielding chamber of the testing platform to form an electromagnetic shielding space for isolating the DUT.

2. The testing system of claim 1, wherein the test-bench module further comprises a testing stand and a test-bench circuit board, and the testing stand is disposed on the test-bench circuit board for carrying the DUT.

3. The testing system of claim 2, wherein the testing stand is a socket or an anisotropic conductive film.

4. The testing system of claim 2, further comprising a signal measuring device for measuring the DUT, the signal measuring device having a signal cable, the electromagnetic shielding chamber further comprising at least one through hole, the signal cable of the signal measuring device being disposed across the electromagnetic shielding chamber through the at least one through hole and being electrically connected with the test-bench circuit board of the test-bench module.

5. The testing system of claim 1, wherein the DUT is an integrated circuit component.

6. The testing system of claim 5, wherein the DUT is a radio frequency integrated circuit component.

7. The testing system of claim 1, wherein the DUT is an integrated circuit module, the integrated circuit module comprising an integrated circuit component, a printed circuit board and an active or passive component.

8. The testing system of claim 7, wherein the DUT is a radio frequency integrated circuit module.

9. The testing system of claim 1, wherein the pick-and-place device further comprises a pick-and-place structure for clasping or drawing the DUT and placing the DUT on the testing stand.

10. The testing system of claim 9, wherein the pick-and-place device further comprises a telescopic structure for driving the pick-and-place device to move vertically relative to the testing platform.

11. The testing system of claim 1, wherein the electromagnetic shielding chamber and the electromagnetic shielding cap are respectively made of metal material.

12. The testing system of claim 1, wherein the signal wiring structure is made of conductive material, two ends of the signal wiring structure respectively correspond to the second signal pin and the second testing contact.

13. The testing system of claim 1, wherein the electromagnetic shielding chamber comprises an electromagnetic shielding base plate and an electromagnetic shielding wall, and the electromagnetic shielding base plate is used for carrying the test-bench module, and the electromagnetic shielding wall is disposed on the electromagnetic shielding base plate and surrounds the test-bench module.

14. A testing method applied in a testing system comprising a testing platform and a pick-and-place device, the testing method comprising steps of:
- (a) providing a device under test (DUT), the DUT having a first signal pin and a second signal pin, the first signal pin being disposed on a lower surface of the DUT, the second signal pin being disposed on an upper surface of the DUT;
- (b) driving the pick-and-place device to place the DUT onto the testing platform;
- (c) electrically connecting the first signal pin and the second signal pin of the DUT to the testing platform;
- (d) utilizing the pick-and-place device to cooperate with the testing platform for forming an isolated space around the DUT; and
- (e) testing the isolated DUT;
- wherein the testing platform further comprises an electromagnetic shielding chamber and a test-bench module, the test-bench module is disposed in the electromagnetic shielding chamber, the pick-and-place device comprising an electromagnetic shielding cap, wherein the step (b) is further to place the DUT on the test-bench module, the step (d) is further to utilize the electromagnetic shielding cap to cooperate with the electromagnetic shielding chamber of the testing platform for forming the isolated space.

15. The testing method of claim 14, wherein the pick-and-place device further comprises a signal wiring structure, the test-bench module has a first testing contact and a second testing contact, and the step (c) further comprises steps of:
- (c1) electrically connecting the first signal pin of the DUT to the first testing contact; and (c2) electrically connecting the second signal pin of the DUT to the second testing contact through the signal wiring structure.

* * * * *